United States Patent
Sato et al.

(10) Patent No.: US 9,460,953 B2
(45) Date of Patent: Oct. 4, 2016

(54) EDGE GRIP SUBSTRATE HANDLER

(71) Applicant: RUDOLPH TECHNOLOGIES, INC., Flanders, NJ (US)

(72) Inventors: Isao Sato, Tokyo (JP); Hiroki Ueno, Tokyo (JP); Yasutoshi Ito, Kumamoto-ken (JP); Masataka Ryu, Kangawa-ken (JP); Troy Palm, Eden Prairie, MN (US)

(73) Assignee: Rudolph Technologies, Inc., Wilmington, MA (US)

( * ) Notice: Subject to any disclaimer, the term of this patent is extended or adjusted under 35 U.S.C. 154(b) by 0 days.

(21) Appl. No.: 14/758,718

(22) PCT Filed: Dec. 20, 2013

(86) PCT No.: PCT/US2013/077102
§ 371 (c)(1),
(2) Date: Jun. 30, 2015

(87) PCT Pub. No.: WO2014/107351
PCT Pub. Date: Jul. 10, 2014

(65) Prior Publication Data
US 2015/0371886 A1    Dec. 24, 2015

Related U.S. Application Data

(60) Provisional application No. 61/748,965, filed on Jan. 4, 2013.

(51) Int. Cl.
*H01L 21/687* (2006.01)
*B25J 11/00* (2006.01)
(Continued)

(52) U.S. Cl.
CPC ...... *H01L 21/68707* (2013.01); *B25J 11/0095* (2013.01); *B25J 15/0014* (2013.01); *H01L 21/67259* (2013.01)

(58) Field of Classification Search
CPC ............ B25J 11/0095; B25J 15/0014; H01L 21/68707; H01L 21/67259
USPC .......................................... 294/213; 414/941
See application file for complete search history.

(56) References Cited

U.S. PATENT DOCUMENTS 5,954,072 A * 9/1999 Matusita ........... H01L 21/68728
134/149
6,095,582 A * 8/2000 Siniaguine .......... H01L 21/6838
294/64.3
(Continued)

FOREIGN PATENT DOCUMENTS

| CN | 101140376 | 3/2008 |
|----|-----------|--------|
| JP | 2003-282670 | 10/2003 |
| WO | 2008-057567 | 5/2008 |

OTHER PUBLICATIONS

PCT Search Report and Written Opinion, PCT/US2013/077102, mailed Apr. 18, 2014, 13 pages.

*Primary Examiner* — Dean Kramer
(74) *Attorney, Agent, or Firm* — Dicke, Billig & Czaja, PLLC (57) ABSTRACT

A mechanism for handling substrates such as semiconductor wafers is disclosed. The mechanism supports the substrate in a tilted orientation to ensure that undesirable contact between a bowed substrate and the mechanism does not occur. The structure that supports the substrate in a tilted orientation may be fixed or adjustable. A sensor may be provided to measure and/or monitor a distance between a substrate and the mechanism. Alternatively, a sensor for determining contact between the substrate and the mechanism may be provided.

20 Claims, 6 Drawing Sheets

(51) Int. Cl.
*H01L 21/67* (2006.01)
*B25J 15/00* (2006.01)

(56) References Cited

U.S. PATENT DOCUMENTS

| | | | |
|---|---|---|---|
| 6,152,677 A * | 11/2000 | Tateyama | H01L 21/67742 414/737 |
| 6,537,416 B1 | 3/2003 | Mayer et al. | |
| 6,752,442 B2 * | 6/2004 | McNurlin | B24B 37/345 294/106 |
| 7,048,316 B1 * | 5/2006 | Blank | H01L 21/67748 294/213 |
| 7,988,216 B2 * | 8/2011 | Ku | H01L 21/67742 294/103.1 |
| 2004/0113444 A1 * | 6/2004 | Blonigan | H01L 21/68707 294/213 |
| 2009/0110520 A1 * | 4/2009 | Kanawade | H01L 21/68707 414/225.01 |
| 2011/0236171 A1 | 9/2011 | Yamamoto et al. | |
| 2012/0049555 A1 * | 3/2012 | FujiI | H01L 21/67742 294/213 |

* cited by examiner

EDGE GRIP SUBSTRATE HANDLER

This Utility Patent Application is a U.S. National Stage filing under 35 U.S.C. §371 of PCT/US2013/077102, filed Dec. 20, 2013, which claims the benefit of U.S. Provisional Patent Application No. 61/748,965, filed Jan. 4, 2013, incorporated by reference herein.

TECHNICAL FIELD

The present disclosure relates generally to handling of substrates and specifically to the handling of semiconductor wafers.

BACKGROUND

Handling of substrates such as semiconductor wafers is performed at various stages of wafer fabrication including front-end-of-line processing, back-end-of line processing, inspection and transport among fabrication components. Devices for handling the substrates are designed to prevent undesired contact between the wafer and other objects, including the device handling the wafer itself.

DETAILED DESCRIPTION

In the following detailed description, reference is made to the accompanying drawings that form a part hereof, and in which is shown, by way of illustration, specific embodiments in which concepts presented herein may be practiced. In the drawings, like numerals describe substantially similar components throughout the several views. These embodiments are described in sufficient detail to enable those skilled in the art to practice the concepts. Other embodiments may be utilized and structural, logical, and electrical changes may be made without departing from the scope of the present concepts. The following detailed description is, therefore, not to be taken in a limiting sense, and the scope of the present concepts is defined only by the appended claims and equivalents thereof.

Figure 1:
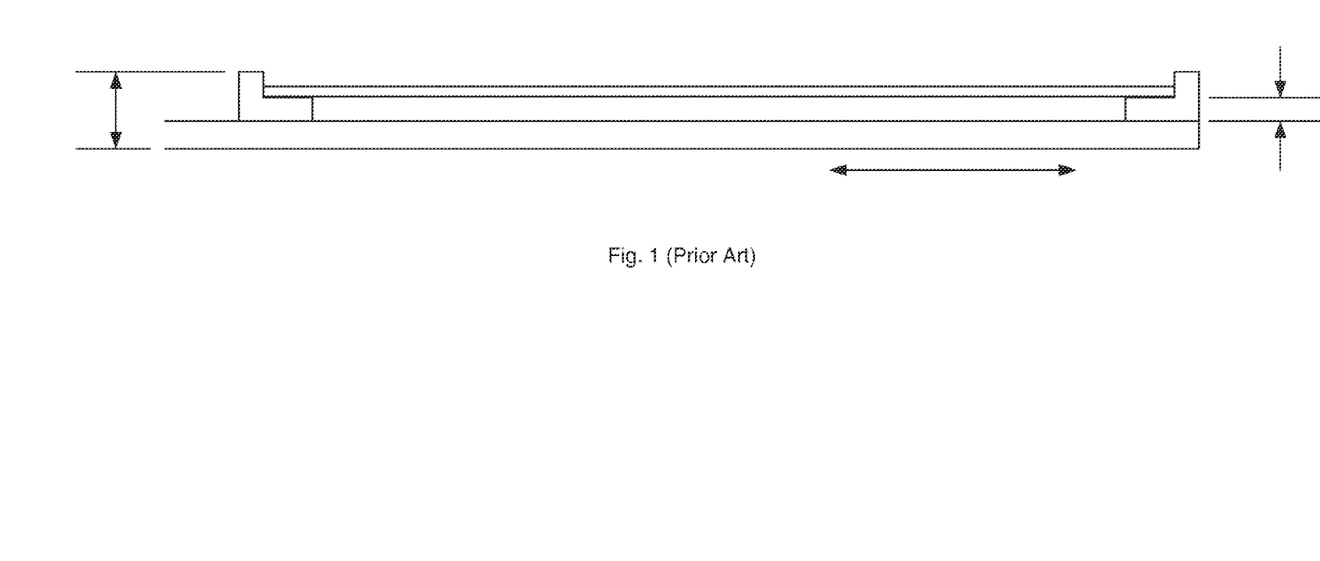
FIG. 1 is a schematic drawing of an idealized prior art edge grip end effector.

FIG. 1 is a schematic drawing of a prior art edge grip end effector that supports a semiconductor wafer. Note that in the prior art system shown in FIG. 1, the wafer and end effector are idealized to the extent that the wafer has no bow and the end effector itself has no droop or deformation. The height or thickness of the end effector must be less than the space ("pitch") between wafers stored in a cassette (not shown). In this way, the end effector may easily remove or replace a wafer in the cassette.

Figure 2:
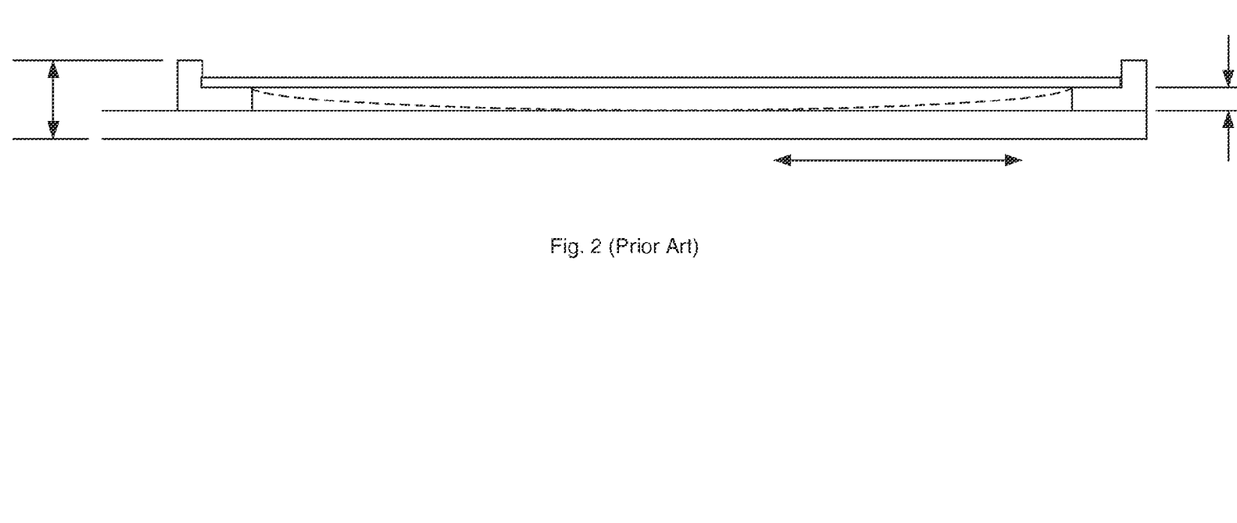
FIG. 2 is a schematic drawing of a prior art edge grip end effector showing the bow of a wafer relative to the end effector.

FIG. 2 is a schematic drawing of an edge grip end effector that shows wafer bow in the dashed line. In the illustrated example, the wafer can bow sufficiently to touch the body of the end effector. As contact between an end effector and a wafer is generally strictly forbidden, such contact can render an otherwise useful edge grip end effector non-functional for a given application. Note that droop in the end effector supporting the wafer is not shown but those skilled in the art will appreciate that an end effector, being a generally spatulate member is subject to beam deformations due to its own weight and the weight of the wafer supported thereon.

Figure 3A:
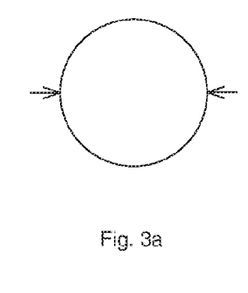
FIGS. 3a-3d illustrate in an exemplary manner some ways in which a wafer may be supported and or clamped at its edges.
Figure 3B:
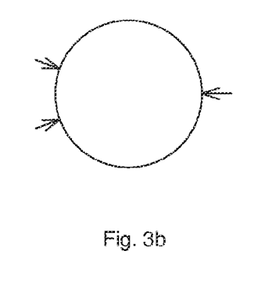
Figures 3C, 3D:
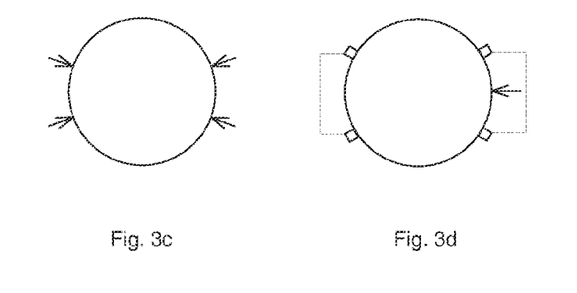

FIGS. 3a-3d illustrate methods whereby a wafer can be gripped at contact points (illustrated as arrows) by its edge for handling. While the wafers W shown in FIGS. 3a-3d are addressed by an end effector in the horizontal plane, each of the embodiments may be accomplished in a right or left-handed manner. While it will be appreciated that FIG. 3a illustrates the bare minimum number of contact points to grip a wafer, this arrangement is somewhat unstable and is therefore disfavored for most applications. FIG. 3b illustrates a stable, 3 point contact arrangement in which the wafer is compressed between the three points of contact. FIG. 3c illustrates a four point of contact arrangement. Additional points of contact may be included if desired. The arrows in FIGS. 3a-3c indicate that force is applied to the edge of a wafer (in the plane of the wafer) to grasp the wafer. Where only horizontal contact is supplied, vertical support of the wafer is provided by the friction between the points of contact and the wafer edge. Force applied to the edge of the wafer can in some cases lead to bowing of the wafer. As such, it can be desirable to minimize the force placed on the edge of the wafer. For example, as can be seen in FIG. 3d, vertical support may be provided in addition to horizontal clamping forces. While four rectangular vertical support pads are illustrated in FIG. 3d, as few as two may be provided for vertical support of the wafer. As many support pads as are desired may be provided in keeping with the principles of the present disclosure. The support pads may be provided with both horizontal and vertical control surfaces. The horizontal control surfaces support the wafer edge in a vertical direction. Vertical control surfaces of the support pad are biased into contact with the wafer's edge to secure the wafer in a given position relative to the end effector on which the support pads are mounted.

As is seen in FIG. 3d, pairs of the support pads are coupled together by dashed lines. The dashed lines are to indicate that while the support pads may be individually supported, it is more often the case that pairs of the support pads or in some embodiments, all of the support pads are coupled to a single end effector.

Figure 4:
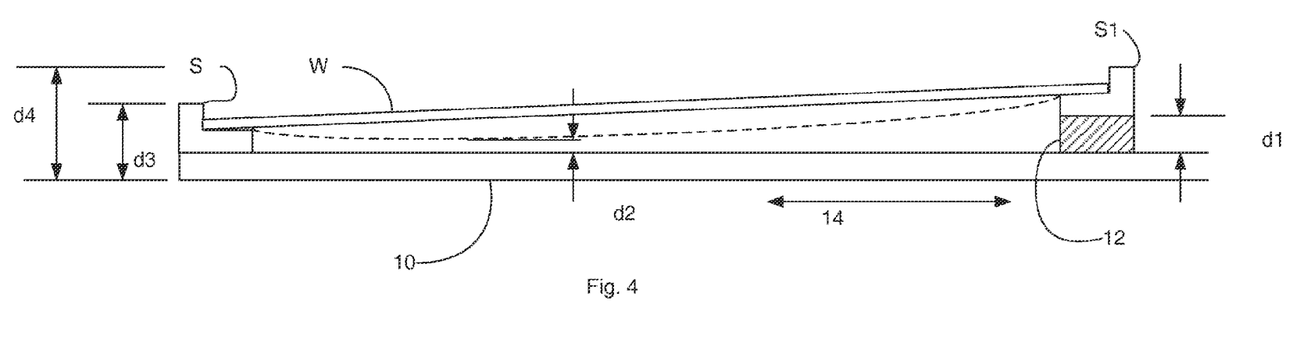
FIG. 4 illustrates one embodiment of a wafer tilt support in use with an end effector.

FIG. 4 illustrates an end effector arrangement according to one embodiment of the present disclosure that accounts for and obviates wafer bow in the automated handling of wafers. The end effector 10 has in this embodiment a number of wafer supports S that support the edges of the wafer W. Rear wafer support S1 is supported on a block 12 that raises an edge of the wafer W to incline the wafer with respect to a direction of travel of the end effector 10 shown by arrow 14. The block 12 raises the edge of the wafer by a distance d1 such that a distance d2 between the central portion of the wafer W and the end effector 10 is non-zero and preferably larger than any oscillations or deformations in the wafer and/or the end effector that might bring the two into contact.

The distance d1 may be determined by modeling the structure of the wafer and/or end effector to compute directly a desired value or range of values. Alternatively, distance d1 may be determined empirically using a sample wafer to measure directly a suitable distance d2. Note that the magnitude of vibrations, oscillations or deformations that may change the magnitude of distance d2 may similarly be modeled (computed directly) or may be measured empirically as described herein below. Regardless, the overall height of the end effector 10, together with the wafer W, which is given by distance d4, is to be less than a pitch between wafers W stored in a cassette (not shown). Ensuring that distance d4 is less than the pitch between wafers W that are to be handled by the end effector 10 will permit the end effector 10 to reliably address each wafer W without causing damage to the wafers W.

Generally speaking the distance d4 is to be minimized to provide as much clearance between the end effector 10 and the wafers W to which the end effector 10 is addressed. One benefit to tilting the wafer W as shown in FIG. 4 is that the overall height of the distal end of the end effector 10, distance d3, may be minimized even as the overall height, distance d4, may be increased. While in the embodiment shown the support S1 is supported on block 12, the height and position of the supports and the block or blocks 12 on which they may or may not be supported may be varied to suit the application at hand. That being said, the goal of the present disclosure is to ensure that no contact between the end effector and the wafer occurs.

While FIG. 4 shows only wafer supports S supporting the wafer W, it should be understood that a gripping mechanism that effectively clamps a wafer between the gripping mechanism and a wafer support may be provided. In one simple embodiment suggested by FIG. 3d, wafer supports S support a wafer above an end effector, i.e., vertically, while a gripping mechanism (represented by the arrow in FIG. 3d) applies force to the edge of the wafer in the plane of the wafer. This clamping force is sufficient to prevent the wafer from moving relative to the end effector and may also be sufficient to secure the wafer to the end effector in the event that the end effector is rapidly accelerated/decelerated or inverted. Note that the gripping mechanism may be used alone or in conjunction with vacuum devices of types known to those skilled in the art. In one embodiment a gripping mechanism may be a reciprocable member having a surface that may be driven in contact with the edge of a wafer to apply clamping pressure thereto or moved away from the edge of the wafer to all a wafer to be picked up or put down. The reciprocable member may be actuated by an actuator such as a pneumatic cylinder, electric motor (rotary or linear), a voice coil, or a more solid state device such as a piezoelectric actuator. Any suitable actuator capable of applying a requisite clamping force may be used.

While blocks 12 of fixed heights may be attached or detached from an end effector to tilt a wafer W, or where the end effector itself may be formed to incorporate directly the distance d1 of the block into its structure, FIGS. 5-8 illustrate alternative embodiments in which the static block 12 is replaced with a directly adjustable wafer support S.

Figure 5:
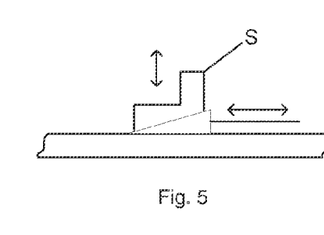
FIGS. 5-8 illustrate schematically adjustable wafer supports.

The wafer support S in FIG. 5 is constrained to move vertically, but may not move in the horizontal XY plane. A vertical actuator, in this case a reciprocable wedge or its equivalent, may be forced into contact with the wafer support S to increase or reduce the distance d1. Note that in this embodiment the wafer support and the wedge have complementary bearing surfaces to ensure that the wafer support does not itself tilt with respect to the wafer. While in some embodiments it is desirable to ensure that the upper support surface of the wafer support on which the wafer rests is substantially parallel to the surface of the wafer that is to be supported, it is possible to create the support S and its complementary actuator with curvilinear surfaces that cause the upper surface of the support S to move in a curvilinear manner as opposed to a linear one. In so doing, one may match the support S surface to the wafer itself. This spreads contact out over a greater area and reduces any damage that might be done to the wafer by the wafer support.

Figure 6:
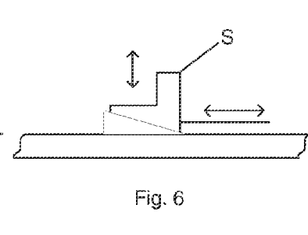

FIG. 6 illustrates a variation of the embodiment of FIG. 5 in which the wedge is stationary and the wafer support S is reciprocable. Whereas the wafer support shown in FIG. 5 cannot apply a clamping pressure to the edge of the wafer, being constrained in the XY plane, the embodiment shown in FIG. 6 may apply a clamping pressure as it moves to a desirable height, i.e., distance d1. Care must be taken to ensure that the geometry of wedge and wafer support are such that an acceptable clamping pressure may be achieved at the same time that an acceptable distance d1 is also achieved.

Figure 7:
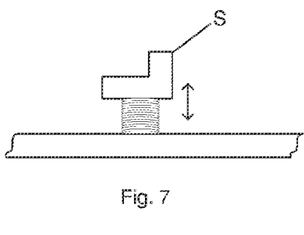

FIG. 7 illustrates a wafer support S that is mounted on a reciprocating device that is in one embodiment a threaded mechanism. The threaded mechanism may be adjustable manually by means of a screwdriver or Allen key or may be automated to adjust the distance d1 of the wafer support.

Figure 8:
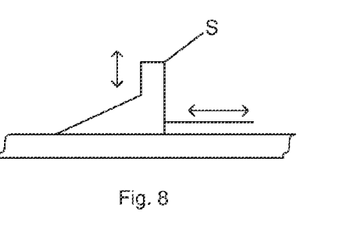

FIG. 8 illustrates a support S that incorporates an inclined bearing surface. The inclined bearing surface may be linear as shown or curvilinear, as desired. The support S is connected to an actuator that moves the support S in the XY plane. As with the embodiment shown in FIG. 6, care must be taken to ensure that the geometry of wedge and wafer support are such that an acceptable clamping pressure may be achieved at the same time that an acceptable distance d1 is also achieved.

It is to be understood that the supports S and clamping devices shown in FIGS. 3a-3d and 5-8 may be used by themselves or in conjunction with one another or with other suitable supports and clamping devices to achieve the desired result of a wafer fully supported and grasped at its edges without contact between the wafer and the remainder of the end effector that is addressed to the wafer.

Figure 9:
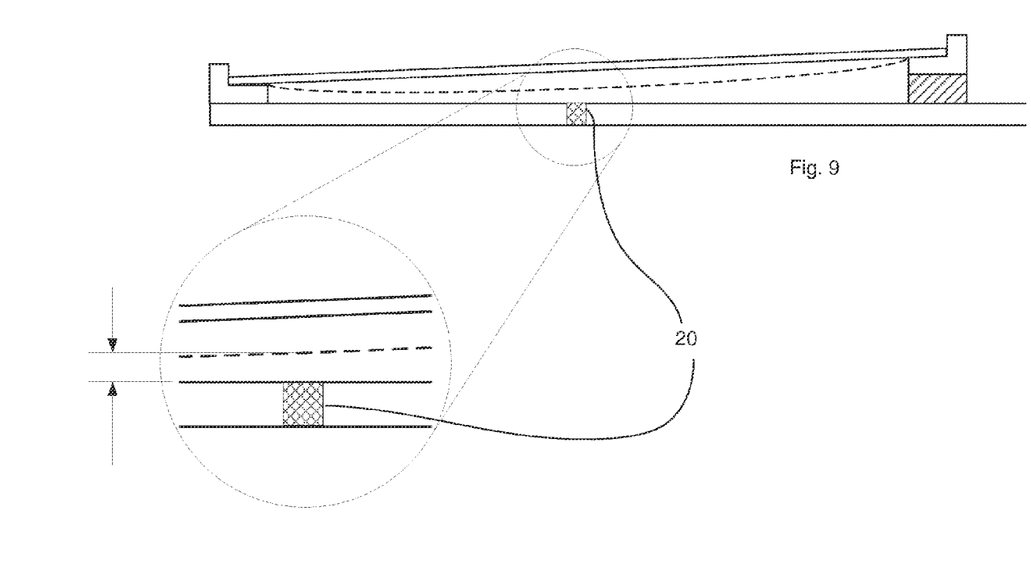
FIG. 9 illustrates one embodiment of a wafer tilt support that includes a sensor to measure a distance between a wafer and an end effector.

FIG. 9 illustrates the use of a sensor 20 to determine whether the distance d2 between the wafer and the end effector is sufficient to avoid contact therebetween. In this embodiment the sensor is embedded in the end effector at or at least near a position at which contact may be expected to occur between a wafer and the end effector. In some embodiments the sensor is used to measure directly the distance d2. In embodiments with the sensor 20 feeler gauges may be used to determine distance d2 (preferably on a set up wafer that may be contacted without costly damage being done).

Optical mechanisms such as a laser triangulation sensor, reflectance measurement sensor, or even an autofocus type sensor may be used to measure the distance d2. Capacitative sensors may also be used. The sensor 20 may be exclusively used to set up a recipe, i.e., a set of instructions and arrangements for carrying out the processing of wafers W. In other embodiments the sensor may be used to both set up a recipe and to monitor the magnitude of distance d2 for all or selected wafers.

Another type of sensor may be used solely to determine whether there has been contact between a wafer and the end effector. For example, a surface acoustic wave sensor (SAW) may be arranged on the surface of the end effector facing the wafer W in or at least near an area in which contact between the wafer and end effector may occur. Continuous monitoring of the SAW in the end effector may reveal when and if a wafer contacts the end effector as the surface acoustic wave set up in the end effector will be modified by contact of the wafer. Other sensors such as impedance sensors may be used to determine whether contact is made between the wafer and end effector.

Figure 10:
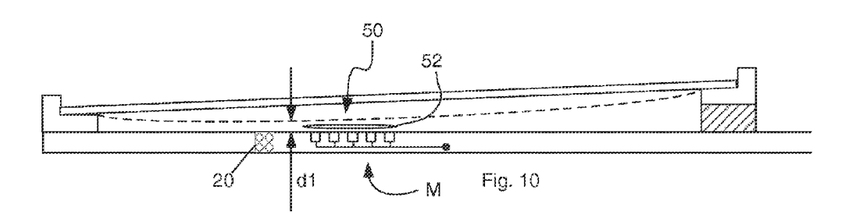
FIGS. 10-11 illustrate one embodiment of a wafer tilt support employing an active cushion mechanism.
Figure 11:
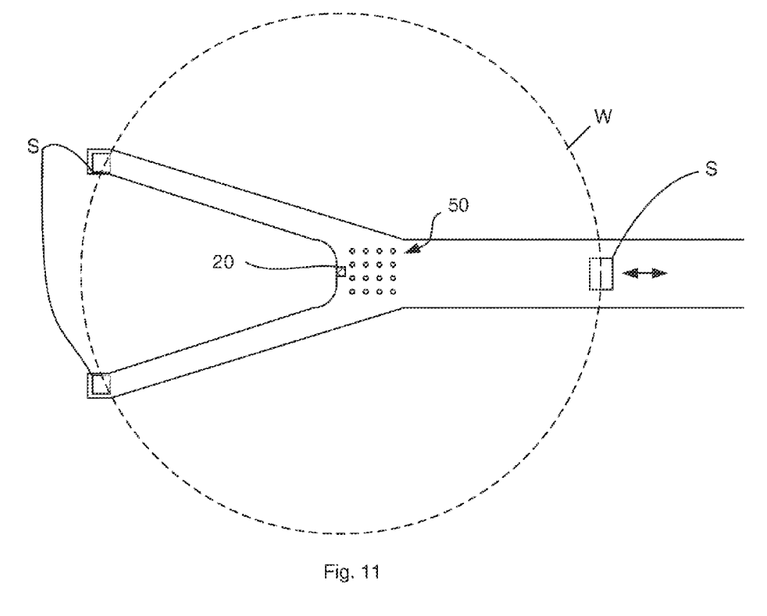

FIGS. 10 and 11 illustrate an embodiment that includes an active cushion mechanism M for preventing and/or minimizing contact between a wafer W and an end effector. The cushion mechanism M is in this embodiment a series of ports 50 that face the wafer W. The ports 50 are pneumatically coupled to a source of compressed gas or in some instances, fluids. Ports 50 may be coupled to the source by means of channels formed directly into the end effector or by means of tubes or conduits secured to the end effector itself. In some embodiments, the ports 50 are connected directly to the source of compressed gas, which creates a cushion of the compressed gas 52 between the wafer W and the end effector whenever the end effector is addressed to a wafer. While compressed gases or fluids may be expressed from the ports 50 continuously, such operation is wasteful and a valve or other shut off mechanism (not shown) is typically provide between ports 50 and the source, the valve being controlled by the same controller that operates the end effector itself. In some embodiments, the ports 50 may be operated selectively based on the proximity of the wafer W to the end effector, i.e., the magnitude of distance d1. Where distance d1 is larger than a predetermined threshold, ports 50 remain disconnected from the source. Where the distance d1 is below the predetermined threshold, ports 50 are connected to the source so as to create a cushion of gas or fluid between the end effector and the wafer W. Note that a sensor such as sensor 20 may be used to determine whether distance d1 is above or below the predetermined threshold value. In other embodiments, a laser used for determining the presence and orientation of wafers within a specialized wafer enclosure such as a FOUP (Front Opening Unified Pod) may also be used. Finally, a user may dictate when ports 50 are to be utilized to prevent or minimize contact between the wafer and the end effector as by manually indicating how and when the ports 50 are to be used.

As seen in FIG. 11, it is useful to place the ports 50 near the center of the wafer W addressed by the end effector. Alternatively, the ports are to be placed as near to the position at which contact is most likely to occur between the wafer and end effector. The gas flowing from the ports 50, which is preferably clean, i.e., free of contaminants and particles, creates an area of high pressure between the wafer W and end effector that prevents contact.

Figure 12:
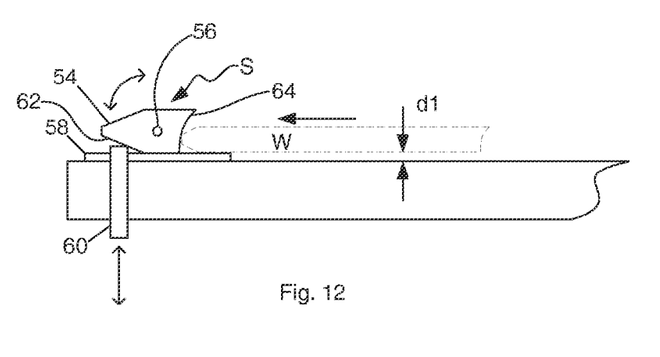
FIGS. 12-13 illustrate schematically one embodiment of an adjustable support.
Figure 13:
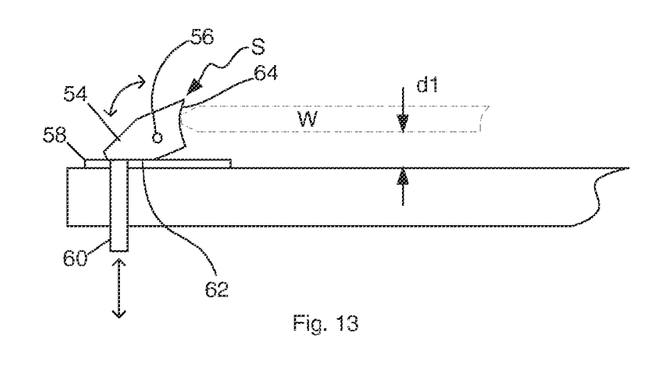

FIGS. 12 and 13 illustrate an embodiment of an adjustable support S that may be used to modify the distance d1 between a wafer W and an end effector such as a spatulate body. As seen in FIG. 12, the body 54 of the adjustable support is coupled to the end effector for rotation about an axis 56 that is perpendicular to the plane of the drawing. A pad 58 (which is in some instances optional) is positioned between the body 54 and the end effector to provide a default support plane for the wafer W. A set screw 60 is addressed to a rear bearing surface 62 of the body 54. The set screw 60 controls an extent of the rotation of the body 54 by contacting the bearing surface 62 opposite a contact face 64 of the body 54 opposite the axis 56. Where the set screw 60 is in direct contact with the bearing surface 62 as shown in FIG. 12, the body 54 may not rotate with respect to axis 56 and the contact face 64 provides a non-moving point of contact between the end effector and the edge of a wafer W. But, where the set screw is positioned away from the bearing surface 62 as shown in FIG. 13, the body 54 may rotate when the contact face 64 is brought into contact with the edge of a wafer W. Because of the complex shape of contact face 64, pressure between the body 54 and the wafer W rotates the wafer W, thereby increasing the distance d1 between the wafer W and the end effector. Judicious adjustment of the extension of the set screw 60 above the pad 58 may increase or decrease the change in distance d1 due to the rotation of the body 54. The contact face 64 of the adjustable support S has a complex shape that securely compresses a wafer W by its edge between one or more other supports (not shown) of a suitable nature. Preferably the contact face 64 will have a curvilinear face that directs force between the wafer W edge into the body above the axis 56, thereby causing rotation. A curvilinear face may be adapted to maintain more or less perpendicular contact between the wafer edge and the contact face 64, though it is understood that faceted or even flat shapes may be used provided that the geometry of contact between the support S and the wafer allows for the describe operation of the support S and secure clamping pressuring therebetween. In some embodiments the support S will have a spring or other resilient member or structure positioned between the bearing surface 62 and the pad 58 to bias the body 54 into the "flat" position shown in FIG. 12. It is foreseeable that one may use a pneumatically actuated pin in lieu of a set screw 60. While the extension of a pin (not shown) above the pad 58 may be mechanically modified in known ways, the actuation between an extended and a retracted position would be essentially binary, being similar to the juxtaposition of the set screw 60 positions shown in FIGS. 12 and 13.

CONCLUSION

While various examples were provided above, the present invention is not limited to the specifics of the examples. Further, although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A wafer handling mechanism comprising:
    a spatulate body having a distal end and proximal end, the distance between the distal end and the proximal end being larger than the wafer that is to be handled; and,
    at least two wafer supports coupled to the spatulate body, a combined maximal height of the spatulate body, wafer, and wafer support being less than a distance between immediately adjacent wafers contained in a cassette of wafers, at least one of the wafer supports having a horizontal support surface at a height sufficiently different from the height of the horizontal support surface of the at least one other wafer support to ensure a non-zero distance between a wafer supported by the wafer supports and the spatulate body;
    wherein the at least two wafer supports includes a first wafer support and a second wafer support, and further wherein the first wafer support defines a maximum horizontal support surface distance of the first wafer support relative to the spatulate body, and further wherein the second wafer support defines a maximum horizontal support surface distance of the second wafer support relative to the spatulate body, and even further wherein the maximum horizontal support surface distance of the first wafer support is greater than the maximum horizontal support surface distance of the second wafer support.

2. The wafer handling mechanism of claim 1 further comprising:
a sensor coupled to the spatulate body for determining a distance between the spatulate body and a wafer supported on the wafer supports coupled to the spatulate body.

3. The wafer handling mechanism of claim 2 further comprising:
one or more ports formed into the surface of the spatulate body adjacent the wafer, the ports being selectively coupled to a source of compressed gas that creates a cushion between the spatulate body and the wafer when the sensor determines that the distance between the spatulate body and the wafer is below a predetermined threshold.

4. The wafer handling mechanism of claim 1 further comprising:
a sensor coupled to the spatulate body for determining whether contact occurs between the spatulate body and a wafer supported on the wafer supports coupled to the spatulate body.

5. The wafer handling mechanism of claim 1 further comprising:
one or more ports formed into the surface of the spatulate body adjacent the wafer, the ports being selectively coupled to a source of compressed gas that creates a cushion between the spatulate body and the wafer.

6. The wafer handling mechanism of claim 1, further comprising a gripping mechanism operable to apply a clamping force on to an edge of a wafer supported by the wafer supports.

7. The wafer handling mechanism of claim 6, wherein the gripping mechanism includes a reciprocal member having a surface selectively driven into contact with an edge of a wafer supported by the wafer supports.

8. The wafer handling mechanism of claim 1, wherein a first spatial location of a first shape of the first wafer support relative to the spatulate body differs from a second spatial location of a second shape of the second wafer support relative to the spatulate body.

9. The wafer handling mechanism of claim 8, wherein the first and second wafer supports are located along the spatulate body to interface with an outer perimeter of the wafer to be handled.

10. The wafer handling mechanism of claim 1, wherein the first and second wafer supports are located along the spatulate body to interface with an outer perimeter of the wafer to be handled.

11. The wafer handling mechanism of claim 1, wherein a combined maximal height of the spatulate body and the first wafer support is greater than a combined maximal height of the spatulate body and the second wafer support.

12. The wafer handling mechanism of claim 11, wherein the first and second wafer supports are located along the spatulate body to interface with an outer perimeter of the wafer to be handled.

13. The wafer handling mechanism of claim 1, wherein the second wafer support is directly coupled to the spatulate body, the wafer handling mechanism further comprising a spacer disposed between the first wafer support and the spatulate body.

14. The wafer handling mechanism of claim 13, wherein the wafer handling mechanism is characterized by the absence of a spacer between the second wafer support and the spatulate body.

15. An adjustable support comprising:
a member rotatively coupled to a spatulate body about an axis of rotation, the axis of rotation being substantially tangent to an edge of a substrate addressed by the spatulate body;
a contact face formed into the surface of the member for contact with an edge of a substrate addressed by the spatulate body, the contact face having a shape such that a force applied thereto by an edge of a substrate to which the spatulate body is addressed causes rotation of the contact face away from the spatulate body;
a bearing surface formed into the member such that a force applied to the bearing surface causes the member to rotate the contact face thereof toward the spatulate body;
an adjustment mechanism configured to control an extent of permitted rotation of the member about the axis, the adjustment mechanism being interposed to a predetermined degree between the bearing surface and the spatulate body; and,
wherein the rotation of the contact face away from the spatulate body causes the movement of the substrate between a first position and a second position, the substrate being farther from the spatulate body in the second position than in the first position.

16. The support of claim 15, wherein the contact face is curvilinear.

17. A wafer handling mechanism comprising:
a spatulate body having a distal end and proximal end, the distance between the distal end and the proximal end being larger than the wafer that is to be handled; and
at least two wafer supports coupled to the spatulate body, a combined maximal height of the spatulate body, wafer, and wafer support being less than a distance between immediately adjacent wafers contained in a cassette of wafers, at least one of the wafer supports having a horizontal support surface at a height sufficiently different from the height of the horizontal support surface of the at least one other wafer support to ensure a non-zero distance between a wafer supported by the wafer supports and the spatulate body;
wherein the at least two wafer supports includes a first wafer support and a second wafer support, and further wherein a combined maximal height of the spatulate body and the first wafer support is greater than a combined maximal height of the spatulate body and the second wafer support.

18. The wafer handling mechanism of claim 17, wherein the first and second wafer supports are located along the spatulate body to interface with an outer perimeter of the wafer to be handled.

19. A wafer handling mechanism comprising:
a spatulate body having a distal end and proximal end, the distance between the distal end and the proximal end being larger than the wafer that is to be handled; and
at least two wafer supports coupled to the spatulate body, a combined maximal height of the spatulate body, wafer, and wafer support being less than a distance between immediately adjacent wafers contained in a cassette of wafers, at least one of the wafer supports having a horizontal support surface at a height sufficiently different from the height of the horizontal support surface of the at least one other wafer support to ensure a non-zero distance between a wafer supported by the wafer supports and the spatulate body; wherein the at least two wafer supports includes a first wafer support and a second wafer support, and further wherein the second wafer support is directly coupled to the spatulate body, the wafer handling mechanism further comprising a spacer disposed between the first wafer support and the spatulate body.

20. The wafer handling mechanism of claim 19, wherein the wafer handling mechanism is characterized by the absence of a spacer between the second wafer support and the spatulate body.

\* \* \* \* \*